United States Patent
Mei et al.

(10) Patent No.: US 8,333,843 B2
(45) Date of Patent: Dec. 18, 2012

(54) PROCESS TO REMOVE METAL CONTAMINATION ON A GLASS SUBSTRATE

(75) Inventors: Fang Mei, Foster City, CA (US); David Tanner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 12/424,954

(22) Filed: Apr. 16, 2009

(65) Prior Publication Data
US 2010/0267192 A1    Oct. 21, 2010

(51) Int. Cl.
C23G 1/02    (2006.01)
B08B 3/00    (2006.01)

(52) U.S. Cl. .................. 134/3; 134/26; 134/28

(58) Field of Classification Search ........... 134/3, 26, 134/28
See application file for complete search history.

(56) References Cited

U.S. PATENT DOCUMENTS

| | | | |
|---|---|---|---|
| 4,665,200 A * | 5/1987 | Nakanishi et al. | 549/239 |
| 5,945,163 A | 8/1999 | Powell et al. | |
| 6,037,241 A | 3/2000 | Powell et al. | |
| 6,058,740 A | 5/2000 | McMaster et al. | |
| 6,300,593 B1 | 10/2001 | Powell | |
| 6,506,260 B1 * | 1/2003 | Hiraishi et al. | 134/15 |
| 6,599,411 B2 | 7/2003 | Dinan et al. | |
| 6,719,848 B2 | 4/2004 | Faykosh et al. | |
| 6,919,530 B2 | 7/2005 | Borgeson et al. | |
| 7,259,321 B2 | 8/2007 | Oswald et al. | |
| 2002/0165105 A1 | 11/2002 | Yates et al. | |
| 2004/0087158 A1 * | 5/2004 | Izumi et al. | 438/689 |
| 2006/0103371 A1 | 5/2006 | Manz | |
| 2007/0103055 A1 * | 5/2007 | Tomai et al. | 313/503 |
| 2007/0236136 A1 * | 10/2007 | Jou et al. | 313/504 |
| 2008/0011321 A1 * | 1/2008 | Ikemoto et al. | 134/1.3 |
| 2008/0012189 A1 | 1/2008 | Manz | |
| 2008/0017222 A1 * | 1/2008 | Miya et al. | 134/21 |
| 2008/0105295 A1 | 5/2008 | Manz | |
| 2009/0000108 A1 | 1/2009 | Manz | |
| 2009/0020149 A1 | 1/2009 | Woods et al. | |

(Continued)

FOREIGN PATENT DOCUMENTS
EP    0482240 A1    4/1992
(Continued)

OTHER PUBLICATIONS
International Search Report mailed on Nov. 22, 2010, for International Application No. PCT/US2010/031060 filed on Apr. 14, 2010, 3 pages.

(Continued)

*Primary Examiner* — Michael Kornakov
*Assistant Examiner* — Nicole Blan
(74) *Attorney, Agent, or Firm* — Kilpatrick Townsend & Stockton LLP

(57) ABSTRACT

The present disclosure relates to methods and related cleaning solutions (116) for cleaning a glass substrate (10, 112), such as for removing metal ion contaminates from a glass substrate (10, 112) having a transparent conductive oxide layer (12). One method includes: providing a glass substrate (10, 112) having a transparent conductive oxide (TCO) layer (12); and exposing the glass substrate (10, 112) to a cleaning solution (116) that includes 0.5% to 5% organic acid, wherein the organic acid used includes citric acid, acetic acid, or oxalic acid.

22 Claims, 4 Drawing Sheets

U.S. PATENT DOCUMENTS

2009/0188543 A1  7/2009  Bann

FOREIGN PATENT DOCUMENTS

| | | |
|---|---|---|
| EP | 1 918 101 A1 | 5/2008 |
| KR | 10-2006-0127098 A | 12/2006 |
| WO | WO 94/29268 | 12/1994 |
| WO | WO 2007/144565 A2 | 12/2007 |
| WO | WO 2008/056116 A1 | 5/2008 |
| WO | WO 2009/030409 A2 | 3/2009 |

OTHER PUBLICATIONS

International Preliminary Report on Patentability issued on Oct. 18, 2011 with the Written Opinion for PCT Patent Application No. PCT/US2010/031060, 5 pages.

* cited by examiner

PROCESS TO REMOVE METAL CONTAMINATION ON A GLASS SUBSTRATE

BACKGROUND

Various embodiments described herein relate generally to methods for cleaning a glass substrate and related cleaning solutions. These methods and related cleaning solutions can be particularly effective for removing metal ion contaminates from a glass substrate having a transparent conductive oxide layer ("TCO glass"). Such glass substrates are used in the formation of some thin-film single-junction and multi-junction solar cells.

Current methods for forming thin-film solar cells involve depositing or otherwise forming a plurality of layers on a substrate, such as a glass, metal or polymer substrate suitable to form one or more p-n junctions. An exemplary thin solar cell includes a glass substrate having a TCO layer, a plurality of doped and undoped silicon layers, and a metal back layer.

TCO glass can be manufactured on or off a production line. On-line production of TCO glass is relatively inexpensive. However, because a glass production line is relatively dirty, on-line production of TCO glass typically results in the presence of significant amounts of metal ion contaminants on the TCO layer, such as Fe, Cu, Mg, Ca, Na, K, and the like. In contrast, off-line production of TCO glass results in relatively low levels of metal ion contaminates on the TCO layer, but is relatively expensive.

While it is preferable to employ less expensive components so as to reduce the cost of resulting solar panels, there is a concern that TCO layer metal ion contamination may degrade a solar panel's efficiency over time. The concern relates to the possibility that the metal ion contaminates on the TCO layer may diffuse into the adjacent silicon layers and thereby degrade the performance of the solar cell.

Accordingly, it is desirable to develop methods and related cleaning solutions that can remove metal ion contaminates from a glass substrate. More particularly, it is desirable to develop methods and related cleaning solutions that can remove metal ion contaminates from TCO glass used in the manufacture of thin-film solar cells.

BRIEF SUMMARY

Disclosed methods and related cleaning solutions provide for effective removal of metal ion contaminates from a glass substrate. Such methods and related cleaning solutions can be particularly effective in the removal of metal ion contaminates from TCO glass used in the formation of thin-film single-junction and multi-junction solar cells. The removal of metal ion contaminates from TCO glass may help to avoid possible degradation in solar cell performance over time that may result from the use of lower-cost production line produced TCO glass.

Methods are provided for cleaning a glass substrate and for removing metal ion contaminants from a glass substrate having a transparent conductive oxide (TCO) layer. A method for cleaning a glass substrate includes providing the glass substrate and exposing the glass substrate to a cleaning solution containing an organic acid. A method for removing metal ion contaminates from a glass substrate having a TCO layer (TCO glass) includes providing the TCO glass and exposing the TCO glass to a cleaning solution that contains 0.5% to 5% organic acid.

Methods for cleaning a glass substrate and for removing metal ion contaminates from TCO glass can involve a number of options. An organic acid can include citric acid, acetic acid, or oxalic acid. A cleaning solution can include 0.5% to 5% organic acid. A cleaning solution can include 1% to 2% citric acid. The exposure time can range from 10 seconds to 5 minutes, and/or can range from 30 seconds to 2 minutes. The glass substrate and/or the TCO glass can be exposed to the cleaning solution at room temperature. The exposure can include immersion in the cleaning solution, which can be agitated or stirred. A method can further include rinsing the glass substrate and/or the TCO glass with de-ionized water before and/or after exposure to the organic acid cleaning solution. The glass substrate and/or the TCO glass can be blow dried following the final rinse.

Cleaning solutions for removing metal ion contaminates from TCO glass are also disclosed. A cleaning solution includes 0.5% to 5% organic acid. A cleaning solution can include 1% to 2% citric acid.

Methods of making solar cells include providing a glass substrate having a transparent conductive oxide (TCO) layer, cleaning the glass substrate by exposing the glass substrate to a cleaning solution, forming a first p-i-n junction over the glass substrate, forming a second p-i-n junction over the first p-i-n junction; forming a TCO layer over the second p-i-n junction, and forming a metal back layer over the TCO layer. The cleaning solution includes a 0.5% to 5% organic acid.

For a fuller understanding of the nature and advantages of the present invention, reference should be made to the ensuing detailed description and the accompanying drawings. Other aspects, objects and advantages of the invention will be apparent from the drawings and the detailed description that follows.

BRIEF DESCRIPTION OF THE DRAWINGS

A further understanding of the nature and advantages of the invention may be realized by reference to the remaining portions of the specification and the drawings wherein like reference numerals are used throughout the several drawings to refer to similar components. When reference is made to a reference numeral without specification to an existing sub-label, it is intended to refer to all such multiple similar components. The Figures are incorporated into the detailed description portion of the invention.

DETAILED DESCRIPTION

In accordance with various aspects and embodiments of the invention described herein, methods and related cleaning solutions are provided for cleaning a glass substrate, such as for removing metal ion contaminates from a glass substrate having a transparent conductive oxide (TCO) layer (i.e, "TCO glass"). Such methods and related cleaning solutions can be particularly beneficial when used to remove metal ion contaminates from production line produced TCO glass before the TCO glass is used to fabricate a thin-film solar cell.

While most detergents fail to remove metal ion contaminates effectively, the cleaning methods and related cleaning solutions disclosed herein may reduce the level of metal contaminates significantly. The provided methods expose a glass substrate to a cleaning solution that can include 0.5% to 5% organic acid, such as citric acid, acetic acid, and/or oxalic acid. The provided methods can include immersion of the glass substrate (e.g., TCO glass) in the organic acid for a period of time, such as 10 seconds to 5 minutes, during which time the cleaning solution can be agitated or stirred. De-ionized water can be used to rinse the glass substrate before and/or after the substrate is exposed to the cleaning solution. Following rinsing with de-ionized water, the glass substrate can be blow dried.

Embodiments also include methods of making solar cells, which include providing a glass substrate having a transparent conductive oxide (TCO) layer, cleaning the glass substrate by exposing the glass substrate to a cleaning solution, forming a first p-i-n junction over the glass substrate, forming a second p-i-n junction over the first p-i-n junction; forming a TCO layer over the second p-i-n junction, and forming a metal back layer over the TCO layer. The cleaning solution includes a 0.5% to 5% organic acid.

Figure 1A:
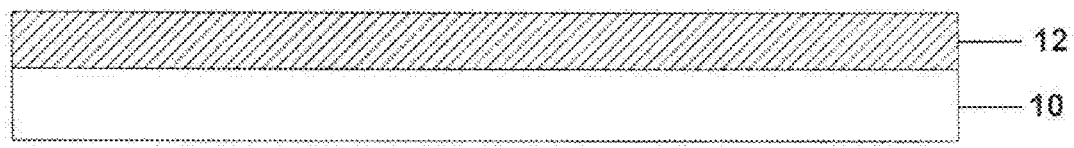
FIG. 1A is a cross-sectional schematic drawing of a glass substrate having a transparent conductive oxide (TCO) layer.
Figure 1B:
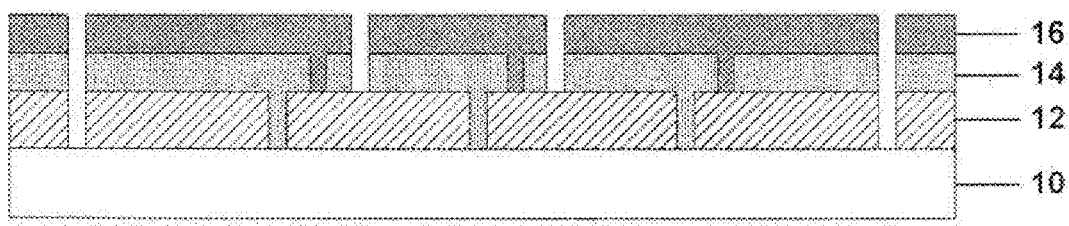
FIG. 1B is a cross-sectional schematic drawing of a thin-film solar cell, showing a patterned TCO layer and adjacently disposed silicon and metal layers.

FIG. 1A illustrates a glass substrate 10 having a TCO layer 12 that has been cleaned using an organic cleaning solution that is ready to have thin film multi-junction solar cells deposited on top. FIG. 1B illustrates how the TCO layer 12 is located adjacent to a plurality of doped and undoped silicon layers 14 and a metal layer 16 in an exemplary thin-film solar cell configuration. By cleaning the substrate 10 and TCO layer 12 with an organic cleaning solution the possibility that metal ion contaminates on the TCO layer 12 may diffuse into the adjacent silicon layers 14 and thereby degrade the performance of the solar cell, is significantly reduced. Examples of materials that can be used to form solar cells, along with methods and apparatus for forming the cells, are described, for example, in co-pending U.S. patent application Ser. No. 11/671,988, filed Feb. 6, 2007, entitled "MULTI-JUNCTION SOLAR CELLS AND METHODS AND APPARATUSES FOR FORMING THE SAME," which is hereby incorporated herein by reference.

Figure 2:
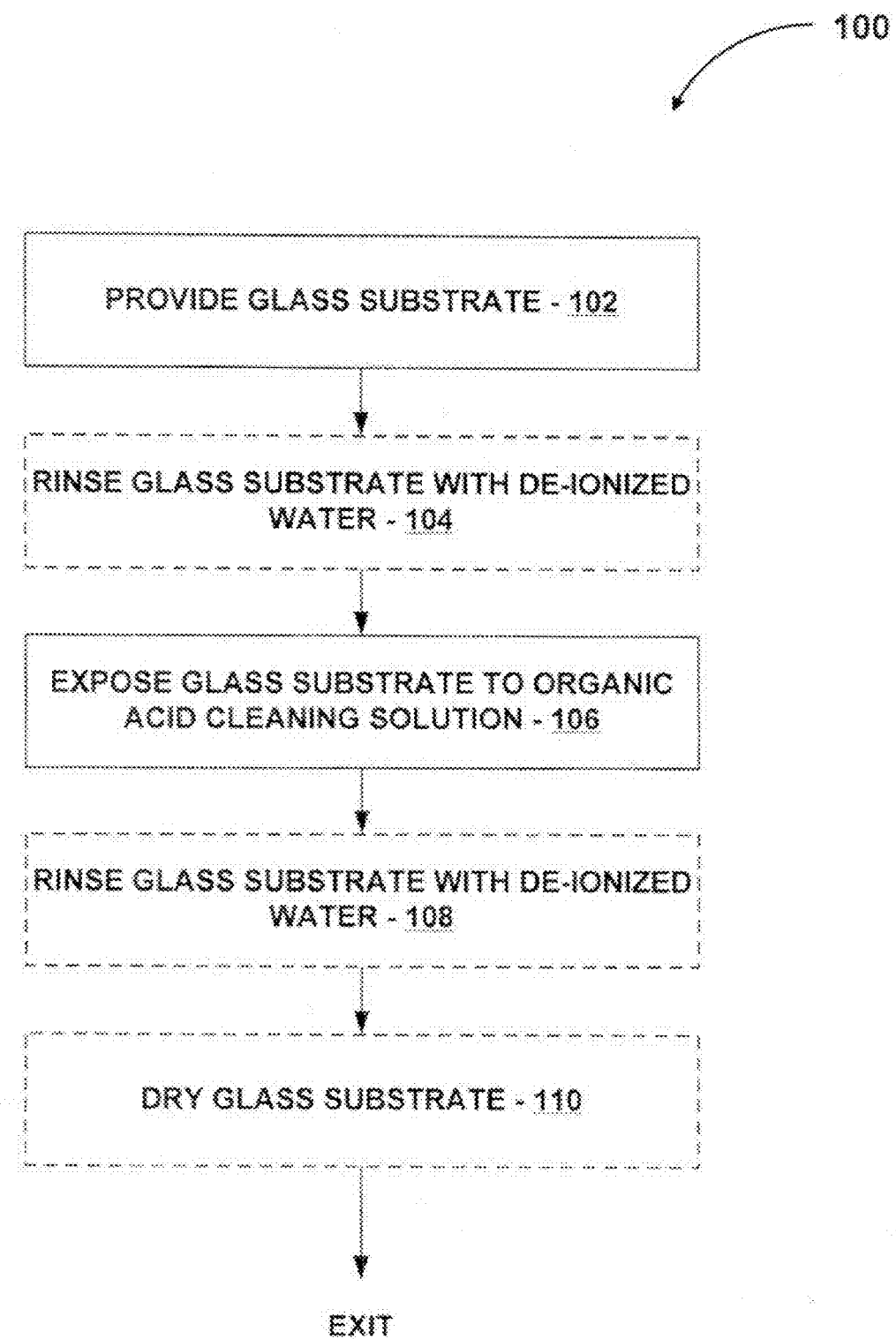
FIG. 2 is a flow chart illustrating a method of cleaning a glass substrate and/or removing metal ion contaminates from a glass substrate having a TCO layer, in accordance with embodiments.

FIG. 2 is a flow chart illustrating a general method 100 of cleaning glass substrates, such as TCO glass. The method 100 begins in operation 102 where glass substrates, such as TCO glass, are provided for cleaning. Next in operation 104, the glass substrate is rinsed with de-ionized water. In some embodiments this operation is optional. In other embodiments the glass substrate is rinsed for a time period ranging from 10 seconds to 10 minutes. In other embodiments the glass substrate can be immersed in a tank of de-ionized water for period ranging from 10 seconds to 10 minutes. If the glass substrate is immersed in a tank containing de-ionized water, the de-ionized water can be agitated or stirred while the glass substrate is immersed.

In operation 106, the glass substrate is exposed to an organic acid cleaning solution. The organic acid cleaning solution can include 0.5% to 5% organic acid, such as citric acid, acetic acid, and/or oxalic acid. The remainder of the cleaning solution can be de-ionized water. The glass substrate can be exposed to the organic cleaning solution for an exposure time ranging from 10 seconds to 2 minutes. The glass substrate can be exposed to the organic cleaning solution by spraying the organic cleaning solution onto the glass substrate or by immersing the glass substrate in a tank of the organic cleaning solution. If the glass substrate is immersed in a tank containing the organic cleaning solution, the cleaning solution can be agitated or stirred while the glass substrate is immersed.

Next in operation 108, the glass substrate is rinsed with di-ionized water. The glass substrate can be rinsed for a time period ranging from 10 seconds to 10 minutes. In other embodiments the glass substrate can be immersed in a tank of de-ionized water for period ranging from 10 seconds to 10 minutes. If the glass substrate is immersed in a tank containing de-ionized water, the de-ionized water can be agitated or stirred while the glass substrate is immersed. In operation 110, the glass substrate is dried. The glass substrate can be dried using various techniques including blow drying the glass with air, nitrogen, argon or other gas. Alternatively, the temperature of the gas used to dry the glass can be at room temperature, higher than room temperature or lower than room temperature. In some embodiments operation 110 is optional.

Figure 3:
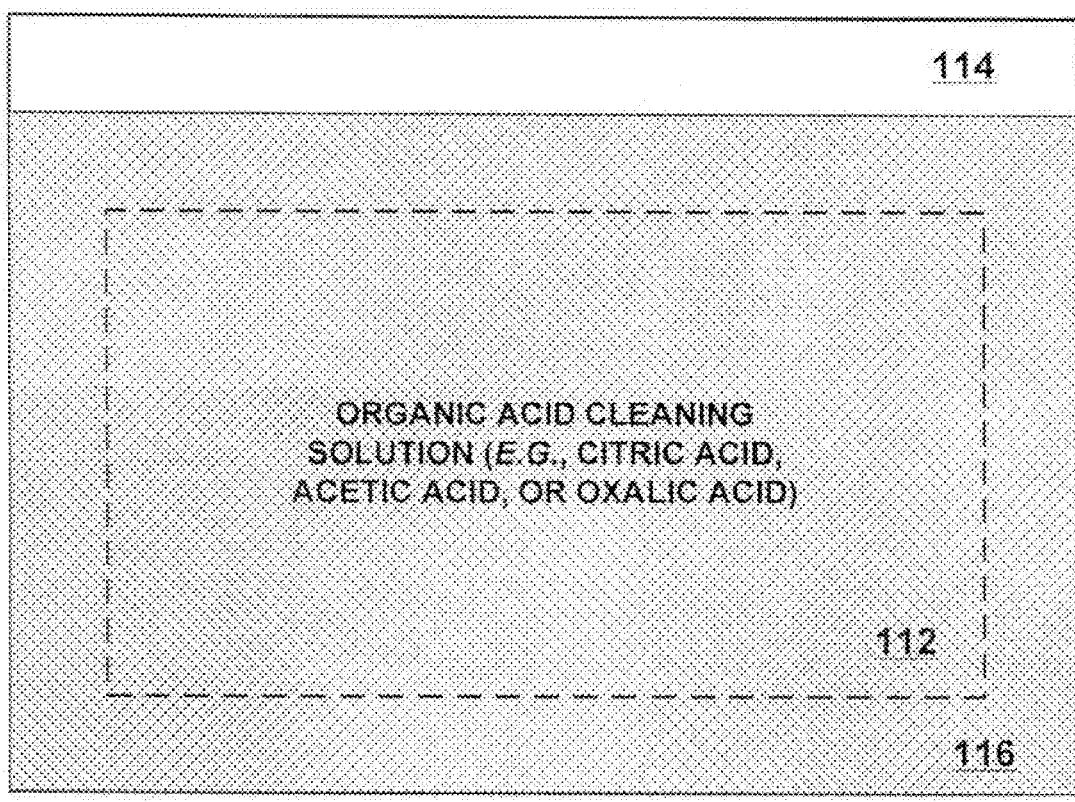
FIG. 3 is an illustration showing a front view of an apparatus used to clean a glass substrate immersed in an organic acid cleaning solution, in accordance with embodiments.

FIG. 3 illustrates a front view of an apparatus used to clean glass substrates including a glass substrate 112, a tank 114 and an organic cleaning solution 116. The glass substrate 112 is cleaned by exposing the glass substrate 112 to the organic acid cleaning solution 116. The glass substrate 112 is shown immersed in a tank 114 containing an organic acid cleaning solution 116. The organic cleaning solution 116 can include one or more of a number of organic acids, such as citric acid, acetic acid, and/or oxalic acid. The concentration of the organic acid can range from 0.5% to 2%. The size of the glass substrate can range from very small sizes such as a few $cm^2$ to large sheets of glass whose dimensions can be 6.5 feet×10 feet or larger. The large sheets of glass can be used in the manufacture of solar cells. When cleaning large glass substrates such as the 6.5 feet×10 feet sheets, care must be taken when moving them around and immersing them in tank 114. For example, the glass sheets can be moved using suction to hold the glass sheets and the glass sheets can be lowered into the tank 114 with a winch or crane. Additional methods of exposing the glass substrate to the cleaning solution can be used (e.g., spraying and the like).

Experimental Results

The following table provides experimental results for exemplary TCO glass specimens.

| Contaminate | No Clean | 0.5% @ 60 sec. | 1% @ 60 sec | 2% at 30 sec. | 2% at 60 sec. |
|---|---|---|---|---|---|
| Aluminum | 2,700 | 1,300 | 470 | 520 | 270 |
| Calcium | 5,800 | 1,100 | 84 | 1,700 | 73 |
| Copper | 480 | 69 | 47 | 40 | 28 |
| Iron | 450 | 190 | 55 | 140 | 33 |
| Lead | 110 | 120 | 130 | 93 | 62 |
| Magnesium | 6,100 | 32,000 | 280 | 360 | 290 |
| Sodium | 85 | 560 | 110 | 490 | 180 |
| Tin | 810 | 26 | 11 | 10 | 10 |
| Titanium | 190 | 850 | <20 | <20 | <20 |
| Zinc | 3,300 | 580 | 590 | 3,400 | 370 |

The experimental results listed above were produced by exposing TCO glass specimens to a citric acid cleaning solution of the specified concentration for the specified amount of time. The "No Clean" data column lists the initial contamination levels for the specified metal ions. All of the listed contamination levels were measured using inductively coupled plasma-mass spectrometry (ICP-MS) and the units are $1.0 \times 10^{10}$ atoms per $cm^2$. As can be seen, exposure to a 1% organic acid solution for 60 seconds results in a significant reduction in the levels of the contaminates. Additionally, exposure to a 2% organic solution for 60 seconds produces a greater reduction in the levels of most of the contaminates, but on a diminishing return basis compared to the use of the 1% organic solution for 60 seconds.

Figure 4:
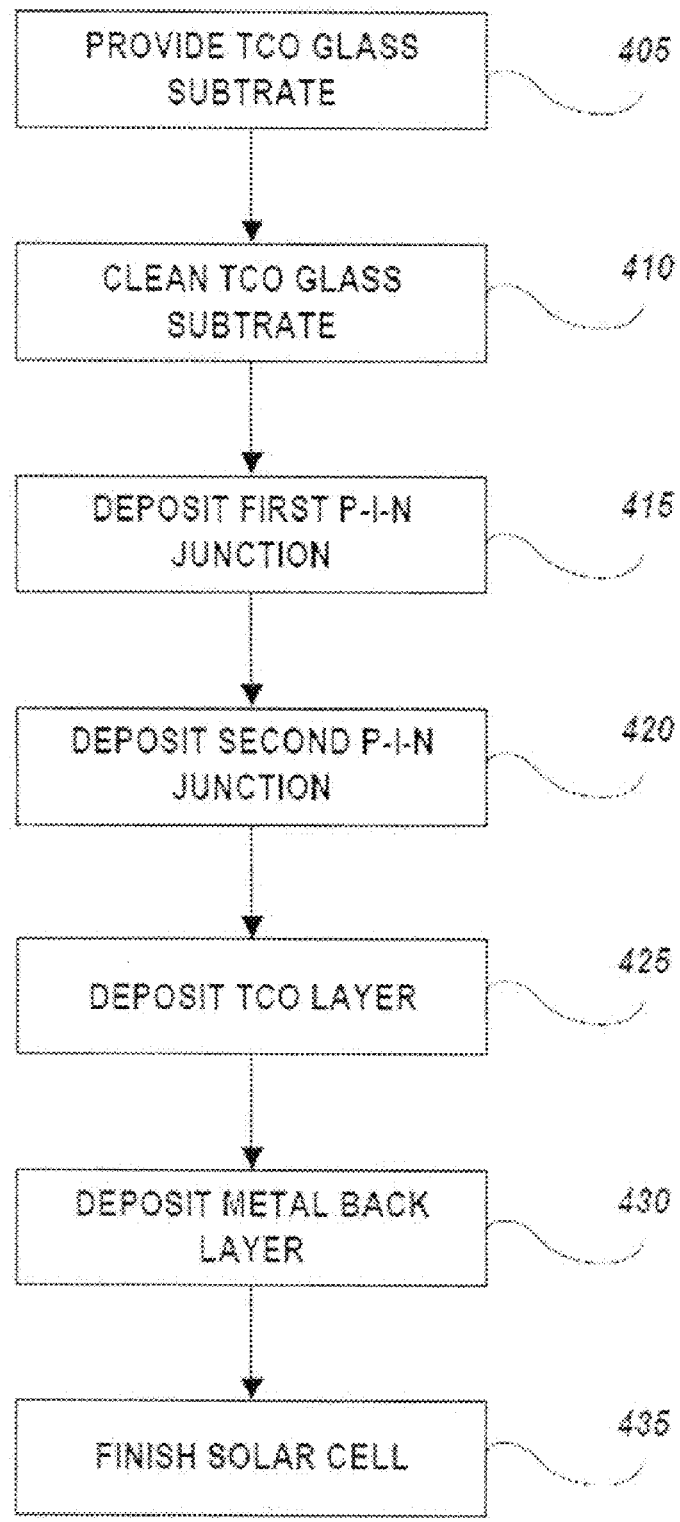
FIG. 4 is a flow chart illustrating a method of forming thin film multi-junction solar cells on TCO glass substrates, in accordance with embodiments.

FIG. 4 is a flow chart illustrating a method of forming thin film multi-junction solar cells on TCO glass substrates. The method begins in operation 405 where a TCO glass substrate is provided for cleaning. In operation 410, the TCO glass substrate is cleaned by first optionally rinsing the TCO glass substrate in de-ionized water, then exposing the TCO glass substrate to an organic acid cleaning solution, then rinsing the TCO glass substrate in de-ionized water again, and then optionally drying the TCO glass substrate. The TCO glass substrate is rinsed in de-ionized water both times for a time period ranging from 10 seconds to 10 minutes by either immersing the TCO glass substrate in a tank of de-ionized water or by spraying the TCO glass substrate with de-ionized water. If the TCO glass substrate is immersed in a tank containing de-ionized water, the de-ionized water can be agitated or stirred while the glass substrate is immersed. The TCO glass substrate is exposed to an organic acid cleaning solution which includes 0.5% to 5% organic acid, such as citric acid, acetic acid, and/or oxalic acid. The remainder of the cleaning solution can be de-ionized water. The TCO glass substrate can be exposed to the organic cleaning solution for an exposure time ranging from 10 seconds to 5 minutes by either spraying the organic cleaning solution onto the TCO glass substrate or by immersing the TCO glass substrate in a tank of the organic cleaning solution. If the TCO glass substrate is immersed in a tank containing the organic cleaning solution, the cleaning solution can be agitated or stirred while the glass substrate is immersed. The glass substrate can be optionally dried using various techniques including blow drying the glass with air, nitrogen, argon or other gas. Alternatively, the temperature of the gas used to dry the glass can be at room temperature, higher than room temperature or lower than room temperature.

After the TCO glass substrate has been cleaned, a first p-i-n junction is deposited in operation 415. The first p-i-n junction is deposited by first forming a p-type amorphous silicon layer, then forming an intrinsic type amorphous silicon layer over the p-type amorphous silicon layer, and then forming an n-type microcrystalline silicon layer over the intrinsic type amorphous silicon layer. Next, in operation 420 a second p-i-n junction is deposited over the first p-i-n junction. The second p-i-n junction is deposited by first forming a p-type microcrystalline silicon layer, then forming an intrinsic type microcrystalline silicon layer over the p-type microcrystalline silicon layer, and then forming an n-type amorphous silicon layer over the intrinsic type microcrystalline layer. In operation 425, a second TCO layer is formed over the second p-i-n junction. Next in operation 430 a metal back layer is formed over the second TCO layer. The metal back layer can be made of various metals and alloys including Al, Ag, Au, Cr, Cu, Pt, or Ti or alloys or combinations thereof. In operation 435 the thin film multi-junction solar cells are completed by performing the remaining sub-operations such as laser scribing processes, packaging and forming interconnects.

In an embodiment, a method for cleaning a glass substrate includes providing the glass substrate and exposing the glass substrate to a cleaning solution containing an organic acid. A method for removing metal ion contaminates from a glass substrate having a TCO layer (TCO glass) includes providing the TCO glass and exposing the TCO glass to a cleaning solution that contains 0.5% to 5% organic acid.

In another embodiment, the organic acid solution can include citric acid, acetic acid, or oxalic acid. The cleaning solution can include 0.5% to 5% organic acid. Alternatively, the cleaning solution can include 1% to 2% citric acid. The exposure time can range from 10 seconds to 5 minutes, and/or can range from 30 seconds to 2 minutes. The glass substrate and/or the TCO glass can be exposed to the cleaning solution at room temperature.

In yet another embodiment, the exposure of the glass substrate and/or the TCO glass can include immersion in the cleaning solution, which can be agitated or stirred.

In yet another embodiment, the method can further include rinsing the glass substrate and/or the TCO glass with de-ionized water before and/or after exposure to the organic acid cleaning solution.

In yet another embodiment, the method can further include drying the glass substrate and/or the TCO glass after it has been rinsed in de-ionized water. The glass substrate and/or the TCO glass can be dried by blow drying in air, argon nitrogen or other gas.

In another embodiment, a method of making a solar cells includes providing a glass substrate having a transparent conductive oxide (TCO) layer, cleaning the glass substrate by exposing the glass substrate to a cleaning solution, forming a first p-i-n junction over the glass substrate, forming a second p-i-n junction over the first p-i-n junction; forming a TCO layer over the second p-i-n junction, and forming a metal back layer over the TCO layer. The cleaning solution includes a 0.5% to 5% organic acid. The organic acid can include citric acid, acetic acid, or oxalic acid. The first p-i-n junction includes a p-type amorphous silicon layer, an intrinsic type amorphous silicon layer over the p-type amorphous silicon layer, and an n-type microcrystalline silicon layer over the intrinsic type amorphous silicon layer. The second p-i-n junction includes a p-type microcrystalline silicon layer, an intrinsic type microcrystalline silicon layer over the p-type microcrystalline silicon layer, and an n-type amorphous silicon layer over the intrinsic type microcrystalline layer.

It is understood that the examples and embodiments described herein are for illustrative purposes and that various modifications or changes in light thereof will be suggested to a person skilled in the art and are to be included within the spirit and purview of this application and the scope of the appended claims. Numerous different combinations are possible, and such combinations are considered to be part of the present invention.

What is claimed is:

1. A method of cleaning a transparent conductive oxide (TCO) layer on a glass substrate, comprising:
    providing the glass substrate with the TCO layer; and
    exposing the TCO layer to a cleaning solution for an exposure time to remove metal ion contaminates from an upper surface of the TCO layer while keeping the TCO layer intact, wherein the cleaning solution consists of deionized water and an organic acid.

2. The method of claim 1, wherein the organic acid comprises citric acid, acetic acid, or oxalic acid.

3. The method of claim 1, wherein the cleaning solution comprises 0.5% to 5% organic acid.

4. The method of claim 3, wherein the cleaning solution comprises 1% to 2% citric acid.

5. The method of claim 1, wherein the exposure time ranges from 10 seconds to 5 minutes.

6. The method of claim 5, wherein the exposure time ranges from 30 seconds to 2 minutes.

7. The method of claim 1, further comprising rinsing the glass substrate with de-ionized water.

8. The method of claim 7, wherein the glass substrate is rinsed with de-ionized water before and after being exposed to the cleaning solution.

9. The method of claim 8, wherein the glass substrate is blow dried following the final rinse.

10. The method of claim 9, wherein the glass substrate is blow dried with a gas including at least nitrogen or argon.

11. The method of claim 1, wherein the exposure occurs at room temperature.

12. The method of claim 11, wherein the cleaning solution is agitated or stirred while the glass substrate is immersed in the cleaning solution.

13. The method of claim 1, wherein the exposure comprises immersion in the cleaning solution.

14. The method of claim 13, wherein the immersion time ranges 10 seconds to 10 minutes.

15. The method of claim 1, wherein the exposure comprises spraying the cleaning solution onto the glass substrate.

16. A method of removing metal ion contaminates from a transparent conductive oxide (TCO) layer on a glass substrate, the method comprising:
   providing the glass substrate with the TCO layer;
   rinsing the glass substrate with de-ionized water; and
   cleaning the TCO layer with a cleaning solution for an exposure time to remove metal ion contaminates from an upper surface of the TCO layer while keeping the TCO layer intact, wherein the cleaning solution consists of deionized water and a 0.5% to 5% organic acid, and wherein the organic acid includes at least one of citric acid, acetic acid, or oxalic acid.

17. The method of claim 16, wherein the cleaning solution comprises 1% to 2% citric acid.

18. The method of claim 16, wherein the exposure time ranges from 30 seconds to 2 minutes.

19. The method of claim 16, further comprising rinsing the glass substrate with de-ionized water after being exposed to the cleaning solution.

20. The method of claim 19, further comprising rinsing the glass substrate with de-ionized water before being exposed to the cleaning solution.

21. The method of claim 19, wherein the exposure comprises immersion in the cleaning solution and the cleaning solution is agitated or stirred.

22. The method of claim 19, wherein the glass substrate is blow dried with a gas including at least nitrogen and argon.

* * * * *